United States Patent
Niewczas et al.

(10) Patent No.: US 12,188,967 B2
(45) Date of Patent: Jan. 7, 2025

(54) PHOTONIC VOLTAGE TRANSDUCER

(71) Applicant: University of Strathclyde, Glasgow Strathclyde (GB)

(72) Inventors: Pawel Niewczas, Glasgow Strathclyde (GB); Grzegorz Fusiek, Glasgow Strathclyde (GB)

(73) Assignee: University of Strathclyde, Glasgow Strathclyde (GB)

( * ) Notice: Subject to any disclaimer, the term of this patent is extended or adjusted under 35 U.S.C. 154(b) by 130 days.

(21) Appl. No.: 17/788,158

(22) PCT Filed: Dec. 22, 2020

(86) PCT No.: PCT/GB2020/053349
§ 371 (c)(1),
(2) Date: Jun. 22, 2022

(87) PCT Pub. No.: WO2021/130487
PCT Pub. Date: Jul. 1, 2021

(65) Prior Publication Data
US 2023/0024557 A1    Jan. 26, 2023

(30) Foreign Application Priority Data
Dec. 23, 2019   (GB) ...................................... 1919237

(51) Int. Cl.
*G01R 15/24*     (2006.01)
*G01L 1/24*     (2006.01)
(Continued)

(52) U.S. Cl.
CPC ............ *G01R 15/247* (2013.01); *G01L 1/246* (2013.01); *G01R 1/36* (2013.01); *G01R 31/085* (2013.01); *H02H 9/045* (2013.01)

(58) Field of Classification Search
CPC ......... G01L 1/246; G01R 1/36; G01R 15/247; G01R 31/085; H02H 9/045; H02H 1/00;
(Continued)

(56) References Cited

U.S. PATENT DOCUMENTS

| 2008/0124020 A1* | 5/2008 | Niewczas | .......... G01D 5/35383 385/13 |
| 2014/0152995 A1* | 6/2014 | Dong | ................. G01D 5/35316 356/477 |

OTHER PUBLICATIONS

International Search Report and Written Opinion for PCT/GB2020/053349 issued on Jun. 4, 2021, from the European Patent Office.
(Continued)

*Primary Examiner* — Feba Pothen
*Assistant Examiner* — Brent J Andrews
(74) *Attorney, Agent, or Firm* — Christopher M. Scherer; DeWitt LLP

(57) ABSTRACT

The invention enables an optical voltage sensor, comprising a piezoelectric actuator mechanically coupled to an optical strain sensor (such as a fibre Bragg grating), to withstand lightning impulses, the effects of which would otherwise be harmful or destructive to the piezoelectric actuator and/or other sensitive components. As such, the optical voltage sensor, comprised within a photonic voltage transducer which also comprises a lightning impulse attenuator, is able to comply with relevant standards and be used for applications in power networks and exposed to the highest voltages for equipment.

19 Claims, 5 Drawing Sheets

(51) Int. Cl.
 *G01R 1/36*  (2006.01)
 *G01R 31/08* (2020.01)
 *H02H 9/04*  (2006.01)

(58) Field of Classification Search
 CPC .. H02H 3/00; H02H 5/00; H02H 6/00; H02H 7/00; H02H 9/00; H02H 11/00; H02H 99/00
 See application file for complete search history.

(56) References Cited

OTHER PUBLICATIONS

International Preliminary Report on Patentability for PCT/GB2020/053349 issued on Nov. 3, 2021, from the European Patent Office.
Rosolem Joao Batista et al: "Optical sensors technologies evolution applied for power quality monitoring in the medium-voltage", Proceedings of SPIE; [Proceedings of SPIE ISSN 0277-786X vol. 10524], SPIE, US, vol. 10654, May 14, 2018.
Fusiek G. et al: "Optical voltage sensor for MV networks", 2017 IEEE Sensors, IEEE, Oct. 29, 2017.
Tzelepis Dimitrios et al: "Single-Ended Differential Protection in MTDC Networks Using Optical Sensors", IEEE Transactions on Power Delivery, IEEE Service Center, New York, NY, US, vol. 32, No. 3, Jun. 1, 2017 (Jun. 1, 2017).
Yang Qing et al: "An optical fiber Bragg grating and piezoelectric ceramic voltage sensor", Review of Scientific Instruments, AIP, Melville, NY, US, vol. 88, No. 10, Oct. 23, 2017.

* cited by examiner

PHOTONIC VOLTAGE TRANSDUCER

CROSS-REFERENCE TO RELATED APPLICATIONS

The present application is the U.S. National Stage application of International Application No. PCT/GB2020/053349, filed Dec. 22, 2020, which International Application was published on Jul. 1, 2021, as International Publication No. WO2021/130487. The International Application claims priority to British Patent Application No. 1919237.6, filed Dec. 23, 2019, the contents of which are incorporated herein by reference in their entireties.

The present invention relates to the field of power transmission and distribution. More specifically, the present invention concerns improvements to optical voltage sensors and related arrangements which enable such sensors to be used for applications in power networks and exposed to the highest voltages for equipment. In an embodiment of the invention an optical voltage sensor is protected from lightning impulses by a lightning impulse attenuator. A photonic voltage transducer, comprising the optical voltage sensor and the lightning impulse attenuator, benefits from the optical fibre typically provided with a power transmission or distribution network and enables reliable measurement without the need for significant investment in equipment and infrastructure.

BACKGROUND TO THE INVENTION

It is desirable from a protection, control and monitoring perspective to be able to measure, in real-time, the voltages and currents on transmission or distribution networks that may comprise of overhead power lines or power cables. The points where it is desirable to perform measurements and/or monitor the condition of the power network are often very long distances (e.g. >50 km) from electricity substations or topside civil structures or are simply difficult to access.

In particular, there has to date been no reliable method by which such voltages can be measured over long distances without requiring a remote sensor, a local power supply and the means to communicate sensor data over the long distance. Generally speaking, methods of measuring such voltages require a sensor incorporating active electronics. Providing power to sensors at remote locations and ensuring reliability of the power supply is a significant problem.

Some approaches utilise copper pilot wires housed within the power cable to deliver power to sensors. These sensors may communicate the measured voltages back along an optical fibre also housed within the power cable. However, although the optical fibre permits long distance communication of measurement data, wire integration within the cable is an added complication (and adds to the cost) and is not applicable to overhead transmission lines. Accordingly, telecommunications equipment may be necessary to transmit the measurement data.

Alternatively, it is known to install transformers which transform the primary line voltage, which may be 10 to 30 kV, down to a low voltage, e.g. 24 to 240 V, to drive the sensor system. This approach is extremely costly as the transformers are expensive. Also, the sensor system powered by such means will stop operating when a fault on the primary system cuts off power to the sensor. A back up battery may be provided, but, again, this adds to the cost, complexity and reduces system reliability. Finally, various power scavenging methods can be utilised, but these are inferior for the same reasons. An approach utilising a passive sensor, not requiring a local power supply, would understandably be beneficial and superior to any of the techniques mentioned above.

Unfortunately, to date, passive sensors which (for example) communicate and/or are interrogated via optical fibres are unsuitable for such applications because of their sensitivity to lightning impulses which can physically destroy them. It may be possible to connect an overvoltage spark gap (or gas discharge tube) in parallel with such a sensor but such devices can be prohibitively expensive, especially when contemplating wide scale deployment of sensors across a power network. Furthermore, overvoltage spark gaps have limited lifetime as their activation may lead to kA-level currents and contain radioactive element Kr85. Additionally, a spark gap will only protect against a voltage level, not the large slew-rate of the voltage, that may still lead to damage of the sensor. Furthermore, such devices do not lend themselves to the kinds of inobtrusive and compact packages desirable for ease of installation.

Accordingly, it is an object of at least one aspect of the present invention to obviate and/or mitigate one or more disadvantages of known/prior arrangements, for example the reliance on supporting infrastructure such as power supplies and telecommunications equipment.

Further aims and objects of the invention will become apparent from reading the following description.

SUMMARY OF THE INVENTION

According to a first aspect of the invention, there is provided a photonic voltage transducer comprising:
 an optical voltage sensor; and
 a lightning impulse attenuator;
 wherein the lightning impulse attenuator is electrically connected in series with the optical voltage sensor to attenuate the voltage sensed by the optical voltage sensor.

The provision of a lightning impulse attenuator in series with the optical voltage sensor protects the optical voltage sensor from high amplitude impulses such as may be caused by a lightning strike on a conductor to which the photonic voltage transducer is connected.

Preferably, the lightning impulse attenuator comprises at least one resistor and at least one inductor. Preferably, the at least one resistor and the at least one inductor are electrically connected in parallel.

In combination with the optical voltage sensor there is provided an RLC circuit. As such, the provision of at least one resistor and at least one inductor, preferably in parallel, allows power frequency, harmonics, and phase to transfer to the optical voltage sensor virtually unchanged. Preferably, the resistance and the inductance are selected to optimise transfer of power frequency, harmonics and/or phase to the optical voltage sensor.

The at least one inductor may comprise at least one coil. The lightning impulse attenuator may further comprise one or more ferrite cores located within the at least one coil. A plurality of ferrite cores may be provided, preferably in a stack. Preferably, the provision of one or more ferrite cores increases the inductance of the at least one inductor.

Preferably, the at least one resistor is located inside the coil, and where applicable inside the one or more ferrite cores.

Optionally, the coil comprises a plurality of coil sections. Optionally, the coil sections are defined and/or separated by a plurality of dielectric spacers. Optionally, the coil comprises a wire having a dielectric coating. Optionally, the coil further comprises a dielectric filler. Preferably, the dielectric constant of the dielectric spacers, dielectric coating and/or dielectric filler are substantially the same. Preferably, each coil section comprises a plurality of winding turns. Preferably, each coil section comprises a plurality of winding layers. Preferably, there is provided an electrical connection between adjacent coil sections. Optionally, the electrical connection comprises a wire joint extending through a respective dielectric spacer.

Preferably, the optical voltage sensor comprises a fibre Bragg grating mechanically coupled to a piezoelectric actuator which expands and contracts responsive to a sensed voltage.

To date, such sensors have not been used for high voltage sensing applications; in fact it would not have been possible to do so until the present invention was conceived, because of the risk of damage or destruction to such sensors in the event of a lightning strike.

Preferably, the piezoelectric actuator comprises one or more ferroelectric hard piezo elements. Preferably, the piezoelectric actuator comprises a stack of ferroelectric hard piezo elements. The one or more piezo elements may be in the form of discs. These may be bonded using an electrically conductive epoxy. The piezoelectric actuator may be composed of a series of physically bonded actuators. The thickness and number of the actuators may be varied to provide a transducer for any desirable voltage level.

It is possible to use ferroelectric hard piezo material due to the lightning impulse attenuator; otherwise such material poses a risk of damage or destruction in the event of a significant impulse. Of course, and for the avoidance of doubt, it is also possible to use ferroelectric soft piezo elements in the same form and/or arrangements as the hard piezo elements defined above.

Preferably, the optical voltage sensor comprises (at least) two electrodes located on opposite sides of the piezoelectric actuator. Preferably, the at least two electrodes comprise invar. The electrodes may be bonded to the piezoelectric actuator using an electrically conductive epoxy.

Preferably, the fibre Bragg grating is mechanically coupled to the piezoelectric actuator by attaching the fibre Bragg grating to the electrodes. Preferably, the fibre Bragg grating is connected to the electrodes via one or more strain amplifying bridges, which may comprise quartz. A fibre section containing the fibre Bragg grating may be bonded to the strain amplifying bridges using an epoxy adhesive and encapsulant.

Optionally, the optical voltage sensor comprises a plurality of fibre Bragg gratings. Two or more of the plurality of fibre Bragg gratings may be located in separate fibre sections. A separate FBG may be used to monitor temperature and may be thermally but not mechanically coupled to the piezoelectric actuator. Alternatively, or additionally, two or more of the plurality of fibre Bragg gratings may be located in a same fibre section which is mechanically coupled to the piezoelectric actuator, for example as described above. Alternatively, or additionally, two or more of the plurality of fibre Bragg gratings may be located in separate fibre sections, each fibre section mechanically coupled to the piezoelectric actuator, for example as described above. Preferably, all of the fibre Bragg gratings are in optical communication, preferably on a same fibre, such that they may be interrogated simultaneously.

Optionally, the photonic voltage transducer is configured to monitor current. Optionally, a piezoelectric actuator of the optical voltage sensor is connected in parallel with a current transformer or a Rogowski coil and a burden resistor.

Alternatively, the photonic voltage transducer further comprises at least one current sensor. Optionally, the current sensor comprises a further optical voltage sensor, wherein a piezoelectric actuator of the further optical voltage sensor is connected in parallel with a current transformer or a Rogowski coil and a burden resistor.

Preferably, the photonic voltage transducer comprises a housing which contains the optical voltage sensor and the lightning impulse attenuator. Preferably, the housing comprises a substantially cylindrical and hollow body, which may be a hollow insulator or electric bushing. The body may comprise porcelain, polymer, a hybrid or composite, or any other suitable insulating material. The housing may comprise one or more flanges at opposite ends of the body. A first flange may be electrically connected to the lightning impulse attenuator and a second flange may be electrically connected to the optical voltage sensor.

Optionally, the first flange comprises a conductor clamp, to permit connection of the photonic voltage transducer directly to a conductor (such as an overhead transmission line). Optionally, the photonic voltage transducer may comprise a connection box, which may provide a means to connect the photonic voltage transducer to earth, and/or may provide optical connections to allow remote interrogation of the optical voltage sensor.

According to a second aspect of the invention, there is provided an optical voltage sensor comprising a fibre Bragg grating and a piezoelectric actuator which expands and contracts responsive to a sensed voltage, the optical voltage sensor further comprising a pair of electrodes electrically and mechanically coupled to opposite sides of the piezoelectric actuator, wherein the fibre Bragg grating is mechanically coupled to the electrodes.

Preferably, the piezoelectric actuator comprises one or more ferroelectric hard piezo elements. Preferably, the piezoelectric actuator comprises a stack of ferroelectric hard piezo elements. The one or more piezo elements may be in the form of discs. These may be bonded using an electrically conductive epoxy.

The fibre Bragg grating may be mechanically coupled to the electrodes via one or more strain-enhancing bridges, which may comprise quartz. The electrodes may comprise invar.

Optionally, the optical voltage sensor comprises a plurality of fibre Bragg gratings.

Embodiments of the second aspect of the invention may comprise features corresponding to the preferred or optional features of any other aspect of the invention or vice versa.

According to a third aspect of the invention, there is provided a lightning impulse attenuator for an optical voltage sensor, the lightning impulse attenuator comprising at least one resistor and at least one inductor in parallel to attenuate high voltage impulses but transfer power frequency, harmonics, and phase to the optical voltage sensor substantially unchanged.

The at least one inductor may comprise at least one coil. The lightning impulse attenuator may further comprise one or more ferrite cores located within the at least one coil. A plurality of ferrite cores may be provided, preferably in a stack. Preferably, the provision of one or more ferrite cores increases the inductance of the at least one inductor. Preferably, the at least one resistor is located inside the coil, and where applicable inside the one or more ferrite cores.

Optionally, the coil comprises a plurality of coil sections. Optionally, the coil sections are defined and/or separated by a plurality of dielectric spacers. Optionally, the coil comprises a wire having a dielectric coating. Optionally, the coil further comprises a dielectric filler. Preferably, the dielectric constant of the dielectric spacers, dielectric coating and/or dielectric filler are substantially the same. Preferably, each coil section comprises a plurality of winding turns. Preferably, each coil section comprises a plurality of winding layers. Preferably, there is provided an electrical connection between adjacent coil sections. Optionally, the electrical connection comprises a wire joint extending through a respective dielectric spacer.

Embodiments of the third aspect of the invention may comprise features corresponding to the preferred or optional features of any other aspect of the invention or vice versa.

According to a fourth aspect of the invention there is provided a monitoring system comprising:
one or more photonic voltage transducers according to the first aspect; and
an interrogator in optical communication with the one or more photonic voltage transducers via an optical fibre.

Preferably, the interrogator comprises a broadband light source to illuminate the optical fibre. Alternatively, the interrogator may comprise a scanning or tuneable laser to illuminate the optical fibre. The optical fibre may be comprised in a power cable, and the one or more photonic voltage transducers may be connected to the power cable. Preferably, the monitoring system comprises a plurality of photonic voltage transducers via the optical fibre and receives a corresponding plurality of optical signals. Each of the plurality of signals may comprise a wavelength unique to the corresponding photonic voltage transducer.

Preferably, the interrogator is configured to determine the or each sensed voltage from the received optical signal. Preferably, the or each sensed voltage is determined from a spectral position of a peak reflection wavelength from the or each fibre Bragg grating of respective photonic voltage transducers. Preferably, changes in the sensed voltage are determined from changes in the peak reflection wavelength.

Preferably, the fibre Bragg grating of the or each photonic voltage transducer has a unique peak reflection wavelength, and the interrogator may comprise a wavelength division multiplexer. Alternatively, the interrogator may comprise a time division multiplexer.

Embodiments of the fourth aspect of the invention may comprise features corresponding to the preferred or optional features of any other aspect of the invention or vice versa.

BRIEF DESCRIPTION OF THE DRAWINGS

There will now be described, by way of example only, embodiments of aspects of the invention with reference to the drawings (like reference numerals referring to like features), of which.

DETAILED DESCRIPTION OF PREFERRED EMBODIMENTS

Figure 1:
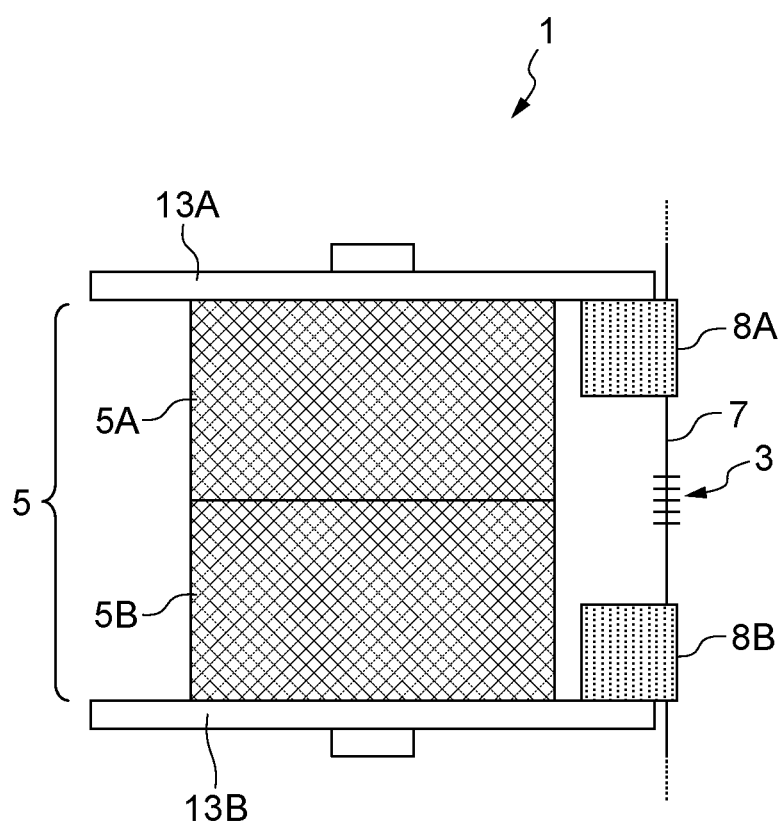
FIG. 1 illustrates an optical voltage sensor in accordance with an aspect of the invention, comprising a fibre Bragg grating mechanically coupled to a piezoelectric actuator.

As discussed in the background to the invention above it is desirable to be able to measure, in real-time, voltages on power networks at long distances and without the need for power supplies, reliance on GPS satellites or telecommunications networks. By utilising optical fibre, whether standalone, wrapped around overhead conductors, provided within the earth overhead conductor or as incorporated in modern power cables or otherwise, the invention allows measurement of high voltages over very long distances (e.g. up to 100 km before signal boosting is required), without any requirement for power supplies, access to GPS satellites or indeed telecommunications equipment, at the measurement locations, while withstanding lightning impulses (or other surges) which might otherwise result in catastrophic damage.

Component parts of an exemplary photonic voltage transducer (PVT) will now be described followed by a description of the assembled PVT and some details of the method of assembly.

Optical Voltage Sensor

The Applicant has developed a voltage sensor which combines an optical strain sensor with a piezo-electric actuator to facilitate the measurement of voltage (and other parameters, such as temperature) at a remote location. WO2005/029005 describes a system for remote measurements comprising a piezo-electric sensor and an optical strain sensor in contact with the piezo-electric sensor.

The optical strain sensor comprises a fibre Bragg grating (FBG) which can be written in the core of an optical fibre using standard writing technologies (such as UV interference and masking). The FBG will reflect at the Bragg wavelength, $\lambda B = 2n\Lambda$, where n is the effective core index of refraction and $\Lambda$ the pitch of the grating. Accordingly, the FBG effectively acts as a wavelength-specific reflector where the peak reflection wavelength is dependent on the pitch of the grating.

The piezo-electric sensor is in physical contact with (e.g. bonded to) the optical fibre in the region of the FBG such that as the piezo-electric sensor expands and contracts under an applied voltage, the FBG is also made to expand and contract thus altering the pitch of the grating and hence the Bragg wavelength. The instantaneous spectral position of the peak reflection wavelength of the FBG is therefore indicative of the voltage applied to the piezo-electric element. Accordingly, a monitoring system can be configured to determine the voltage applied to the piezo-electric element using the instantaneous spectral position of the peak reflection wavelength.

However, piezo-electric sensors are fragile and tests conducted by the Applicant have revealed that exposure to a standard lightning impulse type test, such as that defined by International Standard IEC 60044-7, can result in physical disintegration of a piezo-electric actuator due to the extreme accelerations which it undergoes due to the shape and magnitude of the lightning impulse.

While manufacturers of piezo-electric transducers might recommend pre-loading to prevent excessive internal stresses within the material due to rapid contraction, this would be extremely difficult to realise within the kinds of compact packages which are enabled by the above-mentioned sensor methodology. Alternatively, as noted above, an overvoltage spark gap (or gas discharge tube) could be connected in parallel with the piezo-electric element but this again would be difficult to realise within a compact package, and would protect against voltage level but not the large slew rates which still lead to excessive accelerations. Furthermore, overvoltage spark gaps may be prohibitively expensive and may contain radioactive elements.

FIG. 1 illustrates an optical voltage sensor 1, in accordance with an aspect of the invention, which is based on the same principle as the above-described FBG-based voltage sensor but with a specific configuration and selection of components which are suitable for the measurement of high voltage, such as in power network applications, particularly in combination with the lightning impulse attenuator described below. The optical voltage sensor 1 comprises two piezoelectric discs 5A,5B bonded together (using a thermally and electrically conductive epoxy) to form a piezo-electric actuator 5. The piezoelectric discs 5A,5B are sandwiched between a pair of electrodes 13A, 13B, and are bonded thereto (again, using a thermally and electrically conductive epoxy).

In this embodiment, the piezoelectric discs 5A,5B comprise a ferroelectric hard piezo material which (compared to ferroelectric soft piezo material) which is suitable for high voltage measurements and exhibits superior characteristics which contribute to a high-accuracy device which can be used for applications such as revenue monitoring. However, it is foreseen that a ferroelectric soft piezo material might be employed instead, in which case it may be advantageous to employ a capacitive voltage divider in order to sense high voltages. Also, in this embodiment, the electrodes comprise invar (selected for its low coefficient of thermal expansion and hence high dimensional stability) although any suitable electrode material may be employed. Generally, this would include materials that have very similar thermal expansion coefficients to the piezo and fibre in order to avoid or at least reduce thermally induced stresses during device manufacture and operation.

The optical strain sensor, which comprises a fibre Bragg grating (FBG) 3 written in the core of optical fibre 7, is mechanically coupled to the piezo-electric actuator 5 via quartz strain-amplifying bridges 8A,8B which are bonded (again, using a conductive epoxy) to corresponding electrodes 13A,13B. The quartz bridges 8A,8B each comprise a groove through which the fibre 7 runs, and the fibre 7 is bonded to the bridges (using an epoxy adhesive and encapsulant, which may be UV curable). The purpose of the bridges 8A,8B is to limit the length of the fibre 7 being strained to the area where the FBG 3 is written in order to maximise the effect of the movement of the electrodes which otherwise would unnecessarily strain more of the fibre and result in smaller wavelength shifts. This, in effect, amplifies the strain imparted on the FBG 3.

In this embodiment, the optical voltage sensor 1 is provided with a single FBG, but it is envisaged that more than one FBG may be provided in order to measure other parameters (or provide redundancies). For example, a second FBG may be provided in order to measure temperature. The second (and any further) FBG may be coupled to the piezo-electric actuator in a similar manner to the FBG 3 described above, or thermally but not mechanically coupled to the piezo-electric actuator. Alternatively, a second (and any further) FBG may be written in the optical fibre disposed between the bridges 8A,8B but with a predetermined spatial separation. It is also foreseen that the bridges might comprise a suitable material other than quartz. Again, this would include materials that have very similar thermal expansion coefficients to the piezo and fibre in order to avoid or at least reduce thermally induced stresses during device manufacture and operation. It is most preferred that all of the FBGs can be interrogated (simultaneously) along a single fibre; as such all of the FBGs may be formed in a single fibre or at least spliced together to effectively form a single fibre.

As noted above, the peak reflection wavelength of the FBG 3 depends on the pitch of the grating. As the piezo-electric actuator 5 expands and contracts under an applied voltage (via terminals 9), the FBG 3 is also made to expand and contract thus altering the pitch of the grating and hence the Bragg wavelength. The instantaneous spectral position of the peak reflection wavelength of the FBG 3 is therefore indicative of the voltage applied to the piezo-electric actuator 5. Accordingly, a monitoring system (see below) can be configured to determine the voltage applied to the piezo-electric actuator 5 using the instantaneous spectral position of the peak reflection wavelength.

In an alternative example, the FBG may be attached directly to the electrodes or directly to the piezo-electric actuator itself. Such arrangements may make it more difficult (when constructing the sensor) to equalise the strain over the grating, make it more difficult to pretension the fibre, and may reduce the mechanical strain transfer resulting in reduced performance compared to the bridge attachment arrangement described above. However, such attachment arrangements might be suitable in some cases; for example, if a compact package is required where space is at a premium and/or an equivalent attachment arrangement is available.

Furthermore, instead of two piezo-electric discs, the piezo-electric actuator might comprise a single disc or a stack of several discs, or indeed be of a different shape or form factor (e.g. a ring) as appropriate in the circumstances; for example to fit a specific package or application.

Such a sensor may also be employed as a current sensor by connecting the optical voltage sensor 1 in parallel with a current transformer (CT) and a burden resistor. Monitoring the secondary current of the CT, transformed into a voltage via the burden resistor, would provide a measure of the primary current in a cable enclosed by the CT. A Rogowski coil, which has a dielectric core, may be used in place of the CT. A photonic voltage transducer as described below may be so modified in order to monitor current, or alternatively be provided with separate optical voltage sensors; one to monitor voltage and one employed as a current sensor.

Lightning Impulse Attenuator

Figure 2:
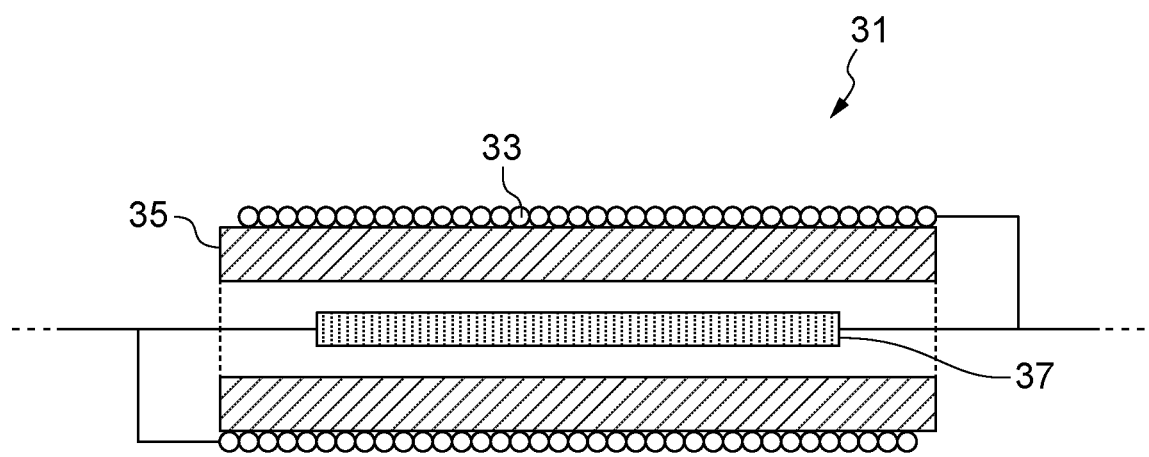
FIG. 2 illustrates, in cross-section, an embodiment of a lightning impulse attenuator in accordance with an aspect of the invention.

FIG. 2 illustrates, in schematic form and not to scale, a lightning impulse attenuator 31, in accordance with an aspect of the invention, which comprises a coil 33, a ferrite core 35 and a resistor 37. In this embodiment, the inductance of the coil 33 is 13 H, and this is increased to 18 H by locating the ferrite core 35 inside the coil 33. The resistor 37, which in this embodiment is a 150 kΩ resistor, is located within the ferrite core 35 for convenience and in the interests of a compact device, although it may be located outside the core 35 and/or coil 33. The resistor 37 and the coil 33 are electrically connected in parallel.

Although a single resistor 37 is shown, the desired resistance may be achieved by two or more resistors connected in series; for example, two 75 kΩ resistors. Furthermore, although the ferrite core 35 is shown as a single annular body, it may instead comprise a plurality of ferrite toroids arranged in a stack. These can be bonded together (for example using an electrically and thermally insulating epoxy) and optionally covered in a heat shrink sleeve to maintain alignment and enable ease of insertion inside the coil 33 during manufacture.

The lightning impulse attenuator 31 can be connected at one end to (for example) the top flange of a photonic voltage transducer as described below, and at the other (bottom) end to the top electrode of an optical voltage sensor (within such a photonic voltage transducer) as described above, so as to reduce both the voltage level and the slew-rate to which the optical voltage sensor 1, and particularly the piezoelectric actuator 5, is exposed. As such, by series connection of the lightning impulse attenuator 31 to the optical voltage sensor 1, mechanical damage to the piezoelectric actuator 5, and the optical voltage sensor 1 in general, is avoided.

It is preferred that the piezoelectric actuator 5 comprises a hard piezo material because it has superior qualities in terms of hysteresis and stability. However, it will be understood that soft piezo material may instead be employed. The impulse protection provided by the lightning impulse attenuator 31 will prevent either type of actuator from being shattered. This construction allows the use of "hard piezo" which has far superior qualities to the soft piezo for the long-term stability or high accuracy of voltage measurement.

Another significant benefit of the arrangement described above is that the resistor 37, the coil 33 and the optical voltage sensor 1, respectively, form an RLC circuit which allows power frequency (and harmonics) to pass through to the optical voltage sensor 1 virtually unchanged (including no significant phase change). As such, measurements on a conductor to which (for example) the photonic voltage transducer described below is connected, can still be performed with high fidelity using the optical voltage sensor despite the presence of an attenuator capable of withstanding a lightning impulse.

The skilled person may draw Bode amplitude and phase transfer functions and fine tune the component values for the given capacitance of the sensor so that the device meets the accuracy specifications for the electronic voltage transformer as per the IEC or IEEE standard but offers significant attenuation of the frequency components of the waveform across the sensor's terminals that are above the highest harmonics specified in the standard and required to be measured by the sensor. The skilled person may devise an algorithm that optimises the RLC values. Otherwise the process of fine tuning may be realised by calculating amplitude and phase for the given frequency, e.g., using a computer, plotting the transfer functions and manually changing the components to achieve a desirable performance—i.e., meet IEC standards but still provide appreciable attenuation at much higher frequencies associated with the fast rising/falling lightning impulse waveform.

Although the lightning pulse attenuator above makes use of a ferrite core located inside a coil so as to increase the inductance of the coil, it may be that the ferrite core (or other inductance-enhancing insert) can be omitted if the coil exhibits sufficient inductance without and/or if a more compact device is desired.

Photonic Voltage Transducer

Figure 3:
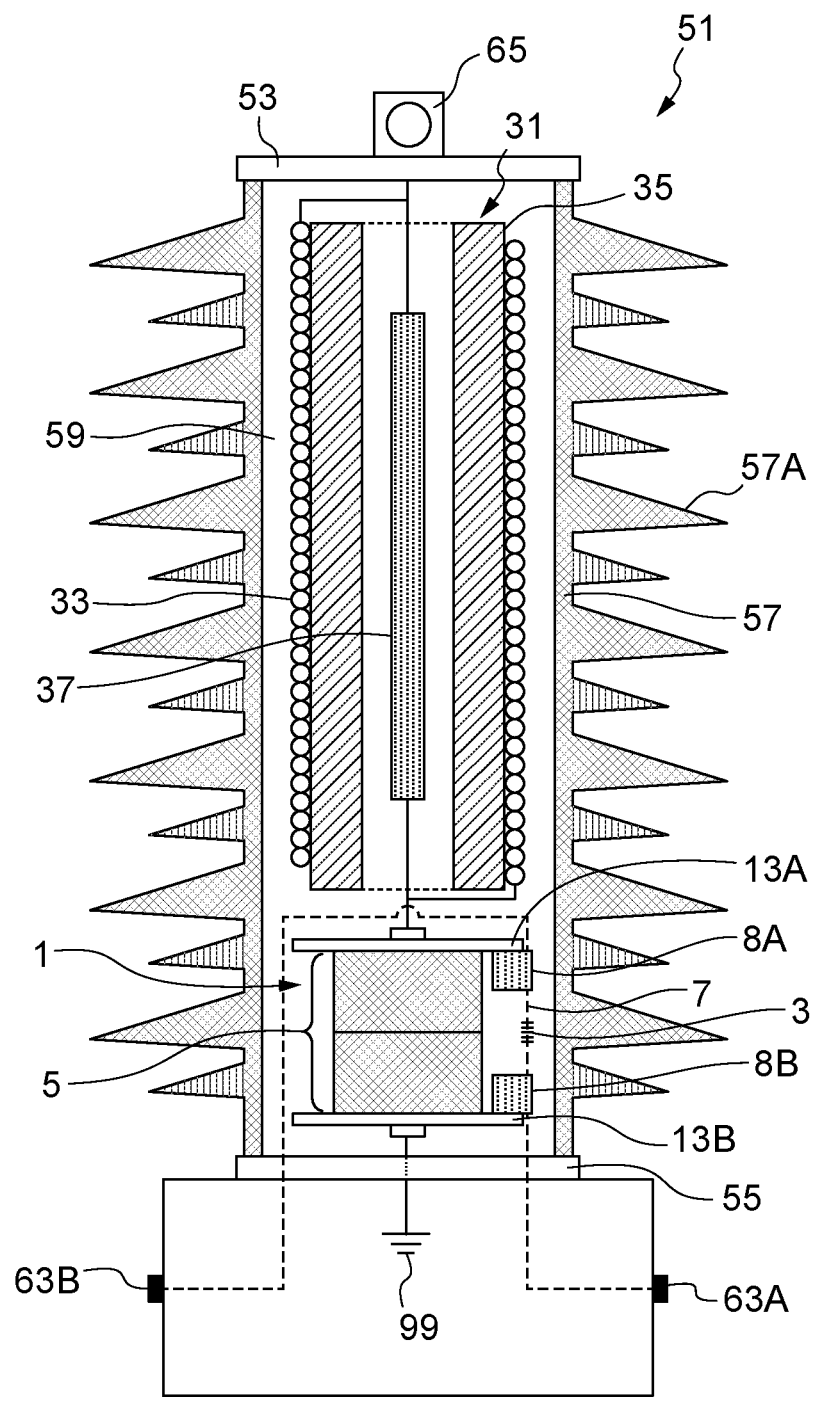
FIG. 3 illustrates, in cross-section, a photonic voltage transducer in accordance with an aspect of the invention.

As intimated above, a photonic voltage transducer (PVT) 51, according to an aspect of the invention and suitable for deployment in a power network, may comprise an optical voltage sensor 1 connected in series with a lightning impulse attenuator 31, as illustrated in FIG. 3.

The PVT 51 comprises a housing which contains the optical voltage sensor 1 and the lightning impulse attenuator 31. The housing is defined by a first or top flange 53 which is electrically connected to the top end of the lightning impulse attenuator 31, a second or bottom flange 55 which is electrically connected to the second or bottom electrode 13B of the optical voltage sensor 1, and an insulative casing 57 comprising a substantially cylindrical and hollow body with a plurality of radial fins 57A (such casings may be referred to as "weathersheds" in the art). The insulative casing 57 can be a hollow insulator or electric bushing as widely used in power networks, overhead transmission lines and the like, and may comprise porcelain, polymer, a hybrid or composite, or any other suitable insulating material.

The second or bottom flange 55 has a plurality of pass throughs to allow the second or bottom electrode 13B to connect to earth (indicated schematically by reference numeral 99) via connection box 61 to which the second or bottom flange 55 is connected. Connection box 61 also comprises input and output optical ports 63A,63B to allow optical interrogation of the FBG 3 (for example as described below in relation to FIG. 4). Note that in FIG. 3, the optical fibre 7 which is disposed between the input and output ports 63A,63B is shown in a dashed line for ease of reference and to distinguish it from the electrical connections which are shown in solid lines.

To allow the PVT 51 to measure or monitor the voltage on a conductor, for example an overhead power cable, the PVT 51 is provided with an (optional) conductor clamp 65 which is connected to the first or top flange 53 (and therefore in electrical communication with the first or top electrode 13A of the optical voltage sensor 1 via the lighting impulse attenuator 31. As described above, the piezoelectric actuator 5 expands and contracts responsive to the sensed voltage, resulting in a corresponding expansion and contraction of the fibre 7 between bridges 8A,8B and hence of FBG 3, with the benefit that the lightning impulse attenuator 31 also permits power frequency, harmonics and phase to pass to the piezoelectric actuator 5 and hence the FBG 3 virtually unchanged.

In the event that lightning should strike the conductor to which the PVT 51 is connected (or the conductor should be subjected to another significant impulse), the lightning impulse attenuator 31 (by way of the RLC circuit formed by the resistor 37, the coil 33 and the optical voltage sensor 1, respectively) will significantly attenuate the fast rising and falling impulse thus avoiding damage to the piezoelectric actuator 5.

It can be advantageous to fill the internal volume 59 of the PVT with a dielectric potting gel or synthetic oil; this can be performed as a last step in the construction or assembly of the PVT 51, with an optional degassing carried out prior to applying the first or top flange 53 which then effectively seals the PVT 51 closed.

In the embodiment above the input and output optical ports comprise bulkhead SC/APC adapters, although any other suitable connection might be provided. It is also foreseen that instead of having a connection box, input and output optical ports might be provided directly on the second or bottom flange of the PVT. Further alternatively it is foreseen that output ports may be dispensed with entirely and the fibre outputs simply spliced or otherwise coupled to an interrogating optical fibre, although this option may not be the most practical. Likewise, the connection box or the second or bottom flange of the PVT itself can be directly earthed or connected to an earth conduit. Note that in an application where it is desirable to measure phase to phase voltage, the bottom flange would not be earthed but connected to another conduit.

Optical Fibre Sensor Monitoring System

Figure 4:
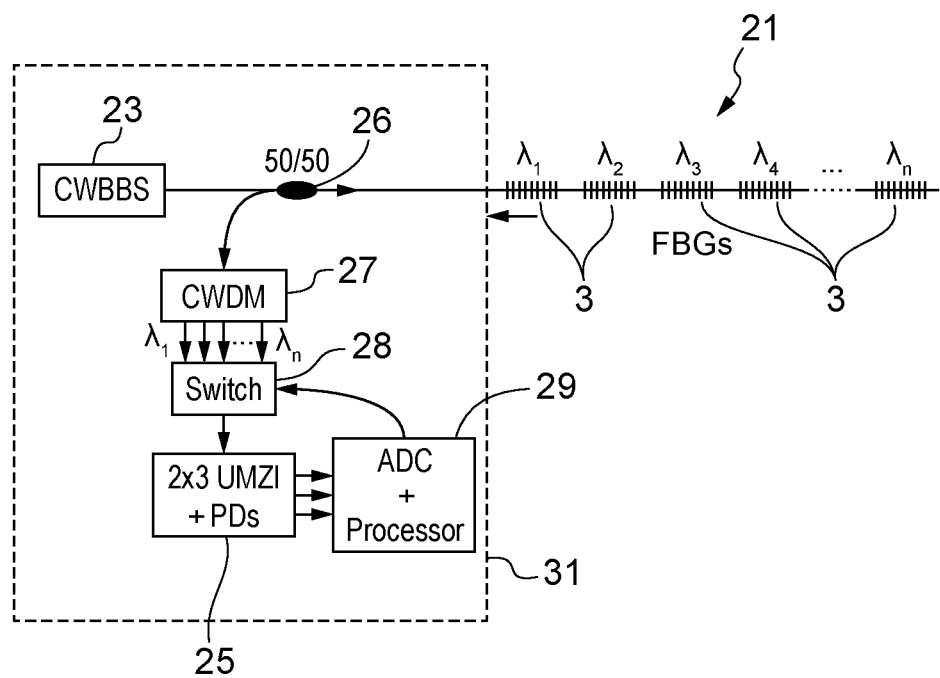
FIG. 4 illustrates, schematically, an optical fibre sensor monitoring system suitable for interrogating the photonic voltage transducer illustrated in FIG. 3.

FIG. 4 illustrates in schematic form a monitoring system 21 suitable for monitoring a plurality (n) of FBGs 3 in an optical fibre 11. Each FBG 3, which may be associated with a specific photonic voltage transducer (PVT) as described above, is sensitive to a different wavelength of light ($\lambda_1$, $\lambda_2$, $\lambda_3, \lambda_4 \ldots \lambda_n$) by appropriate selection of the periodicity of the variation in the refractive index of the fibre core (i.e. the pitch of the grating—see above).

The system comprises a broadband light source 23 for illuminating the optical fibre 11 with an interrogation signal which has a wavelength range covering the reflection wavelengths of all the FBGs 3 located along the optical fibre 11. Light passes along the fibre 11 and light reflected from each of the FBGs 3 is simultaneously and continuously fed into a coarse wavelength division multiplexer (CWDM) 27 (via a coupler 26) which separates light received from the optical fibre 11 into a plurality of wavelengths (and associated fibres) each corresponding with one of the FBGs 3. A fast optical path switch 28, driven by ADC/Processor unit 29, guides the reflected signal from each FBG 3 in turn to an interferometer and demodulation platform 25. Note that in an alternative embodiment, it is envisaged that a plurality of FBGs could be interrogated by a system using a scanning filter or tuneable laser.

The ADC/Processor unit 29 then processes the output from the interferometer and demodulation platform 25 to determine the wavelength of the reflected light in each channel and thereby determine the instantaneous voltage being applied to the piezo-electric element associated with the respective FBG 3. This can be done, for example, by comparing the instantaneous spectral position of the reflection peak with calibration data or a look-up table.

Alternatively, a time division multiplexer (not shown) can be used to separate light received from the optical fibre 11 into a time-separated series. In such an arrangement, the FBGs 3 are not required to exhibit unique peak reflection wavelengths. A combination of time division and wavelength division multiplexing techniques may be used to interrogate very large arrays of FBGs.

Reference numeral 31 generally indicates an interrogator which comprises the broadband light source 23, wavelength division multiplexer 27 and fast optical path switch 28 driven by ADC/Processor unit 29 (which could be replaced with or supplemented by a time division multiplexer), and interferometer and demodulation platform 25.

In an alternative embodiment (not shown), a Fabry-Perot scanning filter can be employed instead of the coarse wavelength division multiplexer and switch components and a single detector instead of the interferometer and demodulation platform. In a further alternative embodiment (also not shown) a wavelength division multiplexer or prism can be employed in place of the coarse wavelength division multiplexer and a linear array of photodetectors (e.g. 256 or 512) employed to achieve spectral decomposition and wavelength division multiplexing. For the avoidance of doubt, these examples are non-limiting and an optical fibre sensor monitoring system can interrogate the PVTs in any suitable way without departing from the scope of invention defined by the appended claims.

Alternative Lightning Impulse Attenuator

Figure 5:
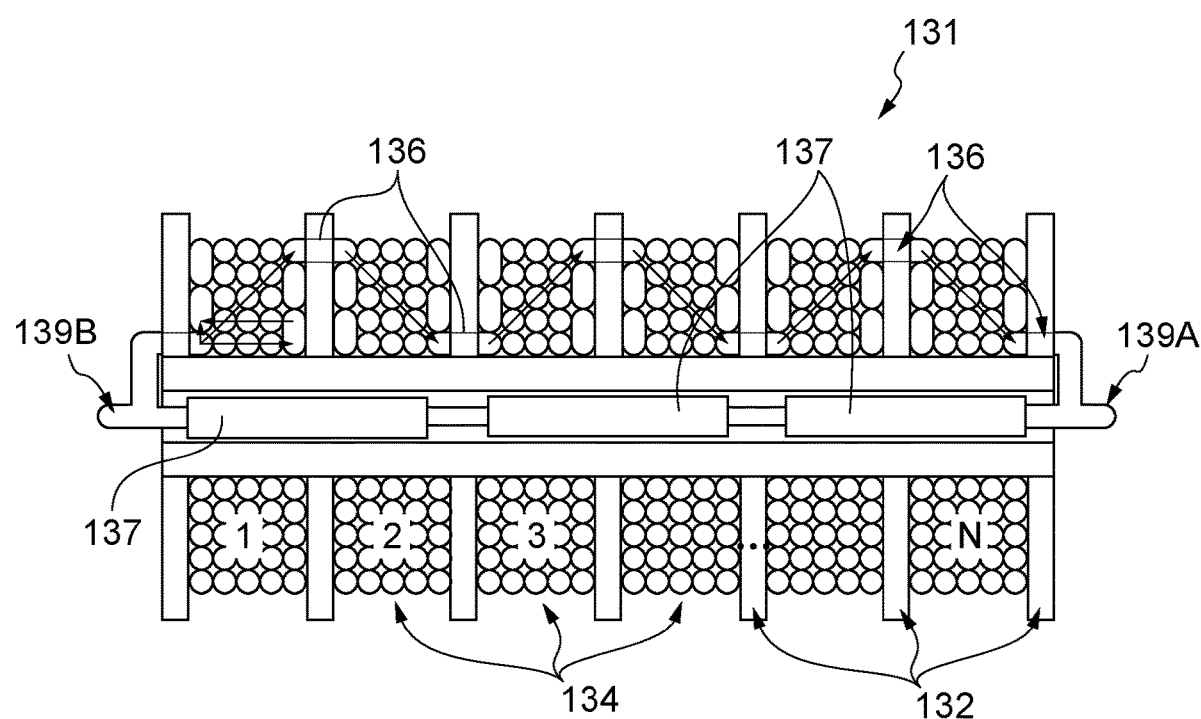
FIG. 5 illustrates, in cross-section, an alternative lighting impulse attenuator in accordance with an aspect of the invention.

FIG. 5 illustrates, in schematic form and not to scale, an alternative lightning impulse attenuator 131, in accordance with an aspect of the invention, which comprises a coil 133, a ferrite core 135 and a number of (in this case three) high voltage resistors 137. As in the previously described embodiment, the inductance of the coil 133 is increased by locating the ferrite core 135 inside the coil 133. The resistors 137 are connected in series and are located within the ferrite core 135 for convenience and in the interests of a compact device, although they may be located outside the core 135 and/or coil 133. As with the lightning impulse attenuator of FIG. 2, the resistors 137 and the coil 133 are electrically connected in parallel.

In this embodiment of the lightning impulse attenuator 131, the coil 133 is specifically wound in such a way as to avoid flashover. This includes the provision of a series of spacers 132 which divide the coil 133 into a series of N coil sections 134. Note that the diagram is schematic, is not to scale, and the winding diameters are exaggerated for ease of understanding. Each winding section 134 comprises L turns and these are laid down in M layers. As illustrated, the coil 133 is wound back and forth in layers within each section 134, and an electrical connection is made through each of the spacers 132 at wire joints 136.

Note that winding separation is defined by the thickness of the insulation or enamel provided on the respective wire. This separation should be sufficient to prevent electrical discharge when exposed to a voltage differential of $2V_L$ ($V_L$ being the voltage drop along one winding layer). As described above, the provision of a dielectric filler is used to displace air between the windings to prevent high electric field gradients that could otherwise lead to dielectric breakdown. Ideally, the dielectric constant of the filler should match or be substantially the same as the insulation or enamel on the respective wire.

Similarly, the spacers 132 should prevent electrical discharge when exposed to a voltage differential of $2V_{LM}$ ($V_{LM}$ being the voltage built up within one section). Ideally, the dielectric constant of the spacer should match or be substantially the same as the insulation or enamel on the respective wire and the dielectric filler, again to prevent high electric field gradients.

An impulse attenuator arranged as above negates the risk of flashover between windings.

The lightning impulse attenuator 131 can be connected via a terminal 139A at one end to the top flange of a photonic voltage transducer as described above, and via a terminal 139B at the other end to the top electrode of an optical voltage sensor (within such a photonic voltage transducer) as also described above, so as to reduce both the voltage level and the slew-rate to which the optical voltage sensor 1, and particularly the piezoelectric actuator 5, is exposed. As such, by series connection of the lightning impulse attenuator 131 to the optical voltage sensor 1, mechanical damage to the piezoelectric actuator 5, and the optical voltage sensor 1 in general, is avoided. As previously stated, it is this impulse protection which enables the piezoelectric actuator 5 to be formed of a ferroelectric hard piezo material (which would otherwise be shattered), with the above-mentioned benefits that this entails.

As described above, the resistor 137, the coil 133 and the optical voltage sensor 1 would, respectively, form an RLC circuit which allows power frequency (and harmonics) to pass through to the optical voltage sensor 1 virtually unchanged (including no significant phase change). As such, measurements on a conductor to which such a photonic voltage transducer is connected can still be performed with high fidelity using the optical voltage sensor despite the presence of an attenuator capable of withstanding a lightning impulse.

The above-described approaches (in relation to the lightning impulse attenuator illustrated in FIG. 2) to optimising the RLC values apply equally to this embodiment of the lightning impulse attenuator.

International Standard IEC 61869

A photonic voltage transducer corresponding to PVT 51 described above has been constructed and subjected to a standard lightning impulse voltage test. The PVT was tested to a withstand voltage of 60 kV in accordance with IEC 61869-1, which requires 15 negative-polarity full-wave voltage applications and 15 positive-polarity full-wave voltage applications. The front-time of the applied impulses was 1.2 µs and the time to half value of the applied impulses was 50 µs, in accordance with IEC 60060-1.

In accordance with IEC 61869-1, the PVT passed the lightning impulse voltage test, as no disruptive discharges occurred during any impulse voltage application, for either negative-polarity full-wave voltage impulses or positive-polarity full-wave voltage impulses. In all cases the PVT withstood the full test voltage application of 60 kV.

The invention enables an optical voltage sensor, comprising a piezoelectric actuator mechanically coupled to an optical strain sensor (such as a fibre Bragg grating), to withstand lightning impulses, the effects of which would otherwise be harmful or destructive to the piezoelectric actuator and/or other sensitive components. As such, the optical voltage sensor, comprised within a photonic voltage transducer which also comprises a lightning impulse attenuator, is able to comply with relevant standards and be used for applications in power networks and exposed to the highest voltages for equipment.

Throughout the specification, unless the context demands otherwise, the terms "comprise" or "include", or variations such as "comprises" or "comprising", "includes" or "including" will be understood to imply the inclusion of a stated integer or group of integers, but not the exclusion of any other integer or group of integers.

Various modifications to the above-described embodiments may be made within the scope of the invention, and the invention extends to combinations of features other than those expressly claimed herein.

The invention claimed is:

1. A photonic voltage transducer comprising:
   an optical voltage sensor; and
   a lightning impulse attenuator;
   wherein the lightning impulse attenuator is electrically connected in series with the optical voltage sensor to attenuate a voltage sensed by the optical voltage sensor;
   wherein the lightning impulse attenuator comprises at least one resistor and at least one inductor connected in parallel;
   wherein the at least one inductor comprises at least one coil; and
   wherein the optical voltage sensor comprises a fiber Bragg grating mechanically coupled to a piezoelectric actuator which expands and contracts responsive to the sensed voltage.

2. The photonic voltage transducer of claim 1, wherein the at least one resistor and the at least one inductor are selected to optimize transfer of power frequency, harmonics and/or phase to the optical voltage sensor.

3. The photonic voltage transducer of claim 1, wherein the lightning impulse attenuator may comprise one or more ferrite cores located within the at least one coil.

4. The photonic voltage transducer of claim 1, wherein the at least one resistor is located inside the at least one coil, and where applicable inside the one or more ferrite cores.

5. The photonic voltage transducer of claim 1, wherein the at least one coil comprises a plurality of coil sections defined and/or separated by a plurality of dielectric spacers.

6. The photonic voltage transducer of claim 5, wherein the at least one coil comprises a wire having a dielectric coating, wherein the at least one coil further comprises a dielectric filler, and wherein the dielectric constant of the plurality of dielectric spacers, the dielectric coating and the dielectric filler are substantially the same.

7. The photonic voltage transducer of claim 5, wherein each of the plurality of coil sections comprises a plurality of winding turns and a plurality of winding layers.

8. The photonic voltage transducer of claim 5, wherein the at least one coil comprises an electrical connection between adjacent coil sections.

9. The photonic voltage transducer of any claim 1, wherein the piezoelectric actuator comprises a stack of one or more ferroelectric hard piezo elements.

10. The photonic voltage transducer of claim 1, wherein the optical voltage sensor comprises two electrodes located on opposite sides of the piezoelectric actuator, wherein the fiber Bragg grating is mechanically coupled to the piezoelectric actuator by attaching the fiber Bragg grating to the electrodes.

11. The photonic voltage transducer of claim 10, wherein the fiber Bragg grating is connected to the electrodes via one or more strain amplifying bridges.

12. The photonic voltage transducer of claim 1, wherein the optical voltage sensor further comprises an additional fiber Bragg grating thermally coupled to the piezoelectric actuator.

13. The photonic voltage transducer of claim 1, wherein the photonic voltage transducer comprises a housing which contains the optical voltage sensor and the lightning impulse attenuator.

14. The photonic voltage transducer of claim 13, wherein the housing comprises a substantially cylindrical and hollow body, which may be a hollow insulator or electric bushing, and which may comprise porcelain, polymer, a hybrid or composite, or other suitable insulating material.

15. The photonic voltage transducer of claim 14, wherein the housing comprises flanges at opposite ends of the body, wherein a first flange is electrically connected to the lightning impulse attenuator and a second flange is electrically connected to the optical voltage sensor.

16. The photonic voltage transducer of claim 15, wherein the first flange comprises a conductor clamp, to permit connection of the photonic voltage transducer directly to a conductor, such as an overhead transmission line.

17. The photonic voltage transducer of claim 1, wherein the photonic voltage transducer comprises a connection box to connect the photonic voltage transducer to earth and/or provide optical connections to allow remote interrogation of the optical voltage sensor.

18. A monitoring system comprising:
   one or more photonic voltage transducers according to claim 1; and
   an interrogator in optical communication with the one or more photonic voltage transducers via an optical fiber.

19. The monitoring system of claim 18, wherein the interrogator comprises a broadband light source or a tuneable laser to illuminate the optical fiber.

* * * * *